United States Patent
Fautz

(10) Patent No.: US 9,651,643 B2
(45) Date of Patent: May 16, 2017

(54) FLOW-SENSITIVE, FREQUENCY-INDEPENDENT EXCITATION OF MAGNETIC RESONANCE SIGNALS

(75) Inventor: Hans-Peter Fautz, Forchheim (DE)

(73) Assignee: Siemens Aktiengesellschaft, München (DE)

( * ) Notice: Subject to any disclaimer, the term of this patent is extended or adjusted under 35 U.S.C. 154(b) by 910 days.

(21) Appl. No.: 13/593,329

(22) Filed: Aug. 23, 2012

(65) Prior Publication Data

US 2013/0214782 A1  Aug. 22, 2013

(30) Foreign Application Priority Data

Aug. 24, 2011 (DE) .......................... 10 2011 081 508

(51) Int. Cl.
  *G01R 33/56* (2006.01)
  *G01R 33/563* (2006.01)

(52) U.S. Cl.
  CPC ....... *G01R 33/56* (2013.01); *G01R 33/56308* (2013.01)

(58) Field of Classification Search
  CPC .............. G01R 33/56; G01R 33/56308; G01R 33/56563; G01R 33/5659
  (Continued)

(56) References Cited

U.S. PATENT DOCUMENTS 4,532,473 A * 7/1985 Wehrli ..................... G01F 1/716
                                                  324/306
5,891,032 A * 4/1999 Harvey ................. G01R 33/446
                                                  324/306

(Continued)

FOREIGN PATENT DOCUMENTS

CN  1851494 A  10/2006
CN  101609132 A  12/2009

OTHER PUBLICATIONS

German Office Action dated Aug. 17, 2012, for corresponding German Patent Application No. DE 10 2011 081 508.2 with English translation.

(Continued)

*Primary Examiner* — Melissa Koval
*Assistant Examiner* — Rishi Patel
(74) *Attorney, Agent, or Firm* — Lempia Summerfield Katz LLC

(57) ABSTRACT

A transmit coil system of a magnetic resonance system is exposed to high-frequency transmit pulses so that atomic nuclei of a predetermined type of atomic nucleus of an examination object introduced into an examination volume are excited by the high-frequency transmit pulses to emit magnetic resonance signals. A gradient magnetic system is exposed to gradient currents during the exposure of the examination volume to the high-frequency transmit pulses so that gradient magnetic fields are superimposed on a basic magnetic field generated by a basic magnet in the examination volume. The gradient currents and the high-frequency transmit pulses are matched to each other such that the atomic nuclei are exclusively those with a velocity lying within or outside a predetermined velocity range. The excitation is independent of variations in the Larmor frequency of the relevant type of atomic nucleus caused by inhomogeneities of the basic magnetic field and/or by chemical displacement.

15 Claims, 4 Drawing Sheets

(58) Field of Classification Search
USPC ......... 324/306, 307, 309, 318; 600/410, 419
See application file for complete search history.

(56) References Cited

U.S. PATENT DOCUMENTS

| | | |
|---|---|---|
| 2004/0162483 A1 | 8/2004 | Kimura |
| 2007/0013374 A1 | 1/2007 | Griswold et al. |
| 2008/0161678 A1* | 7/2008 | Miyazaki et al. ............ 600/419 |
| 2009/0322329 A1 | 12/2009 | Diehl et al. |
| 2012/0283547 A1* | 11/2012 | Wong .................... A61B 5/055 600/410 |

OTHER PUBLICATIONS

K. S. Nayak, "Fast Cardiovascular Magnetic Resonance Imaging," Dissertation submitted to the Department of Electrical Engineering and the Committee on Graduate Studies of Stanford University, pp. 1-115, Jan. 2001.

M. Bernstein et al., Handbook of MRI Pulse Sequences, Elsevier Academic Press, pp. 658-661, 2004.

L. de Rochefort et al., "Velocity-Selective RF Pulses in MRI," Magnetic Resonance in Medicine 55, pp. 171-176, 2006.

C. Yip et al., "Iterative RF Pulse Design for Multidimensional, Small-Tip-Angle Selective Excitation," Magnetic Resonance in Medicine 54, pp. 908-917, 2005.

Chinese Office action for related Chinese Application No. 201210305305.4, dated Nov. 19, 2015, with English Translation.

* cited by examiner

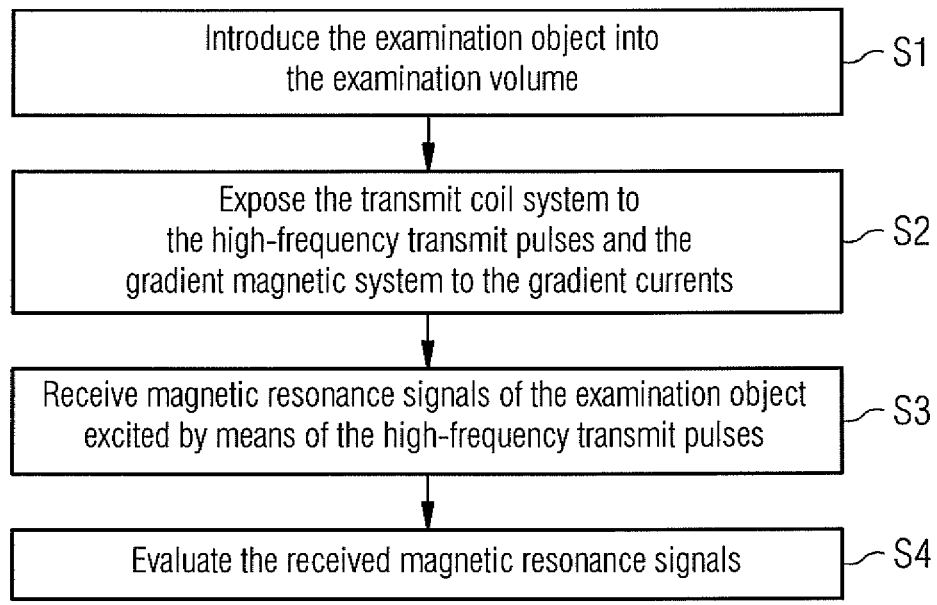
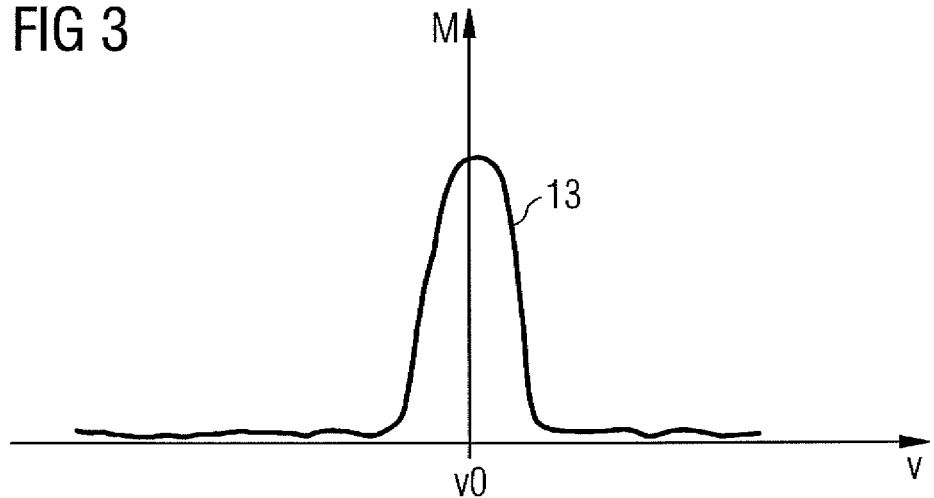

FLOW-SENSITIVE, FREQUENCY-INDEPENDENT EXCITATION OF MAGNETIC RESONANCE SIGNALS

This application claims the benefit of DE 10 2011 081 508.2, filed on Aug. 24, 2011.

BACKGROUND

The present embodiments relate to an operating method for a magnetic resonance system.

Operating methods for magnetic resonance systems are described in, for example, the paper "Iterative RF Pulse Design for Multidimensional, Small-Tip-Angle Selective Excitation" by Chun-yu Yip et al., Magnetic Resonance in Medicine, Volume 54 (2005), pages 908 to 917. The paper "Velocity-Selective RF Pulses in MRI" by Ludovic de Rochefort et al., Magnetic Resonance in Medicine, Volume 55 (2006), pages 171 to 176, also describes an operating method.

The excitation and later detection of magnetic resonance signals may be performed with the aim of examining the tissue of an examination object (e.g., a human being). The morphological information may be relevant. Site-selective excitation of the magnetic resonance signals may take place. In the case of examinations of this kind, variations in the Larmor frequency of the relevant type of nucleus caused by inhomogeneities of the basic magnetic field and/or by chemical displacement may result in artifacts on reconstruction.

It is known from the above-named paper by Chun-yu Yip et al. how to determine high-frequency transmit pulses and gradient currents correlated therewith. Using the high-frequency transmit pulses and the gradient currents, in the case of site-selective excitation, excitation may also take place when variations in the Larmor frequency of the relevant type of nucleus may not be excluded.

For this, Chun-yu Yip et al. utilize the approach $$M(\vec{r}) = i\gamma M_0(\vec{r}) \int_0^T \text{HF}(t)\exp(i\vec{k}(t)\vec{r})dt \quad (1)$$

Here, M is the magnetization actually occasioned at a specific site $\vec{r}$. $\gamma$ is the gyromagnetic ratio, and $M_0$ is basic magnetization. HF is a basic amplitude curve (e.g., an envelope curve) as a function of time. $\vec{k}$ is a factor determined in the usual way from the gradient magnetic field at the site in question.

Chun-yu Yip et al. inserted an additional term into the above equation allowing for the phase development due to spatial variation $\Delta\omega(\vec{r})$ of the Larmor frequency. The modified equation is as follows $$M(\vec{r}) = i\gamma M_0(\vec{r}) \int_0^T \text{HF}(t)\exp[i\vec{k}(t)\vec{r} + i\Delta\omega(\vec{r})(T-t)]dt \quad (2)$$

Unlike equation 1, equation 2 may not be solved analytically. However, equation 2 may be solved using iterative solving methods such that the resultant magnetization M corresponds to a prespecified target magnetization or that a standard representing a measure for the difference between actual magnetization and target magnetization is minimized.

Chun-yu Yip et al. mention that k-space based selective excitation has been used in a range of magnetic resonance applications. Mentioned as examples are functional artifact correction, blood velocity measurement, parallel excitation using an array of transmit coils and excitation inhomogeneity correction.

It is known from the above-named paper by Ludovic de Rochefort et al. how to determine high-frequency transmit pulses and gradient current correlating therewith. Using the high-frequency transmit pulses and the correlating gradient current, velocity-selective excitation of atomic nuclei may take place. However, the transmit pulses recommended by Ludovic de Rochefort et al. are sensitive to variations in the Larmor frequency (e.g., the transmit pulses) are not independent.

SUMMARY AND DESCRIPTION

The present embodiments may obviate one or more of the drawbacks or limitations in the related art. For example, the evaluation of flow-sensitive information using magnetic resonance techniques may be improved.

In one embodiment, an operating method includes matching gradient currents and high-frequency transmit pulses to each other such that atomic nuclei excited to cause the emission of magnetic resonance signals are exclusively atomic nuclei with a velocity lying either within or outside a predetermined velocity range. The excitation is independent of variations in the Larmor frequency of the type of atomic nucleus in question caused by inhomogeneities of the basic magnetic field and/or by chemical displacement.

Flow-sensitive excitation of atomic nuclei is also possible when the Larmor frequency of the predetermined type of nucleus is subject to variation.

The transmit coil system may include a plurality of transmitting antennas. The transmitting antennas are simultaneously exposed to respective high-frequency transmit pulses. This procedure enables frequency independence to be achieved in a simple way. This even applies with only a few (e.g., 2, 3, 4 or more) transmitting antennas operated in parallel.

The high-frequency pulses may, for example, include a plurality of temporally successive subpulses with the shape $$pS(t) = AS \cdot A0(t) \cdot \sin(2\pi ft + \phi S) \quad (3)$$

where pS is the respective subpulse, t is the time, AS is a factor, A0 is a uniform basic amplitude curve for all subpulses, f is a frequency and $\phi$S is a phase. The factor, the frequency and/or the phases may be subpulse-specific.

In one embodiment, the gradient magnetic system may be exposed to gradient currents between the exposure of the examination volume to the subpulses. This procedure simplifies the design of the subpulses. This may be the case when the gradient currents, to which the gradient magnetic system is exposed between the exposure of the examination volume to the subpulses, are determined such that the zero moment has the value zero, and the first moment has a value different from zero.

Alternatively or additionally, the gradient magnetic system may be exposed to gradient currents during the exposure of the examination volume to the subpulses. This procedure makes the design of the subpulses and the gradient currents flexible. The gradient currents, to which the gradient magnetic system is exposed during the exposure of the examination volume to the subpulses, may be determined such that the gradient currents generate a time-varying gradient trajectory.

The predetermined velocity range may be determined as required. If the atomic nuclei excited have a velocity within the predetermined velocity range, the predetermined velocity range may not encompass the velocity zero. Otherwise, the predetermined velocity range may encompass the velocity zero.

In another embodiment, software may be configured such that the execution of machine code (e.g., including instructions) by the control device causes the control device to operate the magnetic resonance system according to an operating method according to the present embodiments. The machine code may be stored on a non-transitory computer-readable medium.

In yet another embodiment, a control device that is programmed such that the control device operates the magnetic resonance system according to an operating method according to the present embodiments is provided.

In one embodiment, a magnetic resonance system, with which the control device is configured according to the present embodiments and operates the transmit coil system and the gradient magnetic system according to an operating method according to the present embodiments, is provided.

BRIEF DESCRIPTION OF THE DRAWINGS

FIG. 2 shows a flowchart of one embodiment of a method for operating a magnetic resonance system;

FIG. 3 shows a possible velocity selectivity; and

DETAILED DESCRIPTION OF THE DRAWINGS

Figure 1:
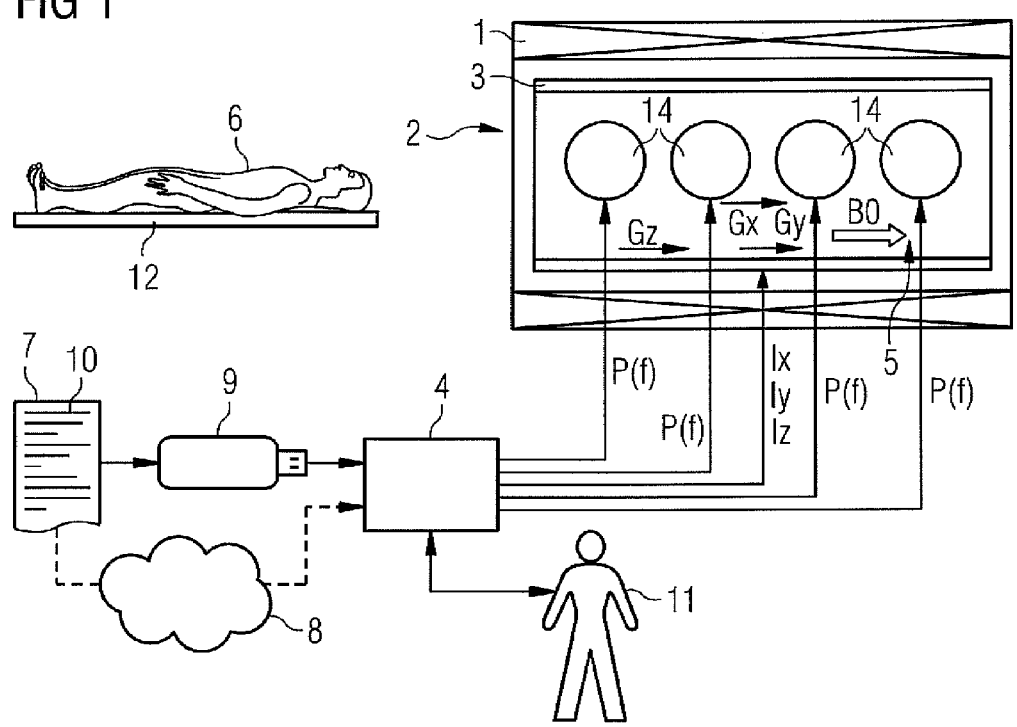
FIG. 1 shows one embodiment of a magnetic resonance system.

According to FIG. 1, a magnetic resonance system includes a basic magnet 1. The basic magnet 1 generates a temporally static basic magnetic field B0 that is locally homogeneous in an examination volume 2 of the magnetic resonance system. The basic magnetic field B0 may, for example, have a strength of 1.5 tesla or 3 tesla. The basic magnet 1 may be supraconductive.

The magnetic resonance system also includes a gradient magnetic system 3. The gradient magnetic system 3 acts on the examination volume 2. The gradient magnetic system 3 may be exposed to gradient currents Ix, Iy, Iz by a control device 4 (e.g., a controller) of the magnetic resonance system. The exposure of the gradient magnetic system 3 to the gradient currents Ix, Iy, Iz causes the basic magnetic field B0 to be superimposed by gradient magnetic fields Gx, Gy, Gz.

The magnetic resonance system also includes a transmit coil system 5. The transmit coil system 5 also acts on the examination volume 2. The controller 4 may expose the transmit coil system 5 to high-frequency transmit pulses P. The exposure of the transmit coil system 5 to the high-frequency transmit pulses P causes atomic nuclei of an examination object 6 introduced into the examination volume 2 to be excited to cause the emission of magnetic resonance signals. The frequency f of the high-frequency transmit pulses P is to be matched exactly to the type of nucleus. The frequency f is determined by the gyromagnetic ratio γ of the corresponding type of nucleus and the magnetic field prevailing at the site of the respective atomic nucleus. For protons in a magnetic field of 3 tesla, this is, for example, about 127.2 MHz.

The controller 4 may be configured as a software-programmable control. Therefore, the mode of operation of the controller 4 is determined by corresponding software 7, with which the controller 4 is programmed. The software 7 may, for example, be supplied to the controller 4 via a network connection 8 (e.g., LAN, WAN, WWW; indicated by dashed lines in FIG. 1). Alternatively, the software 7 may be supplied to the controller 4 via an electronic data carrier 9 (e.g., a non-transitory computer-readable medium such as a USB memory stick, SD memory card, CD-ROM), on which the software 7 is stored in (exclusively) machine-readable form.

The software 7 includes machine code 10 (e.g., including instructions) that may be processed directly by the controller 4. The processing of the machine code 10 (e.g., the instructions) determines the mode of operation of the controller 4. For example, the processing of the machine code 10 causes the controller 4 to operate the magnetic resonance system (e.g., the transmit coil system 5 and the gradient magnetic system 3) according to an operating method that is described in more detail below.

According to FIG. 2, the examination object 6 is introduced into the examination volume 2 of the magnetic resonance system in act S1. The introduction of the examination object 6 may be performed manually by an operator 11. Alternatively, the controller 4 or another controller may control a drive of a patient bed 12 so that the examination object 6 enters the examination volume 2 by a motorized device.

In act S2, the controller 4 exposes the transmit coil system 5 to the high-frequency transmit pulses P. This causes the atomic nuclei of the type of atomic nucleus of the examination object 6 determined by the frequency f to be excited to cause the emission of magnetic resonance signals. During the exposure of the examination volume 2 to the high-frequency transmit pulses P (e.g., as part of act S2), the gradient magnetic system 3 is exposed to the gradient currents Ix, Iy, Iz. This causes the basic magnetic field B0 to be superimposed by the gradient magnetic fields Gx, Gy, Gz.

In act S3, magnetic resonance signals of the examination object 6 excited by the high-frequency transmit pulses P are received. In act S4, the received magnetic resonance signals are evaluated.

The present embodiments are concerned with the high-frequency transmit pulses P and the gradient currents Ix, Iy, Iz output to the gradient magnetic system 3 during the high-frequency transmit pulses P. This is because the gradient currents Ix, Iy, Iz and the high-frequency transmit pulses P are matched to each other such that the atomic nuclei excited to cause the emission of magnetic resonance signals are exclusively atomic nuclei with a velocity v, according to FIG. 2, lying within a predetermined velocity range 13 around an average velocity v0. Alternatively, the gradient currents Ix, Iy, Iz and the high-frequency transmit pulses P may be matched such that the atomic nuclei excited are exclusively atomic nuclei with a velocity v lying outside the predetermined velocity range 13. The gradient currents Ix, Iy, Iz and the high-frequency transmit pulses P are matched to each other such that the excitation of the atomic nuclei in question is independent of variations in the Larmor frequency of the relevant type of nucleus. Corresponding variations in the Larmor frequency of the type of nucleus in question may, for example, be caused by inhomogeneities of the basic magnetic field B0 and/or by chemical displacement of the gyromagnetic ratio γ.

The corresponding matching of the gradient currents Ix, Iy, Iz and the high-frequency transmit pulses P to each other may be achieved in different ways.

Figure 4:
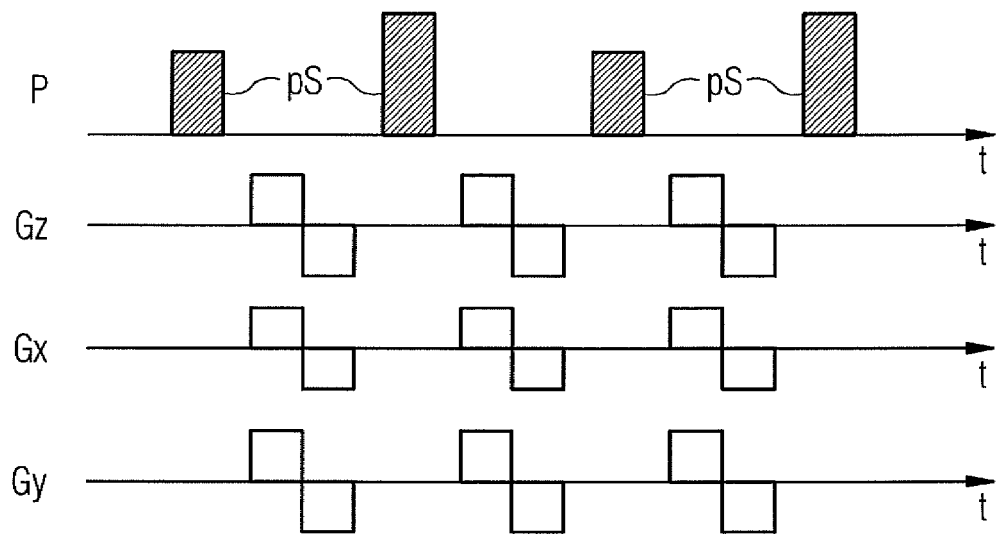
FIGS. 4 to 7 show possible pulse combinations.

The high-frequency transmit P, according to FIG. 4, may include a number of temporally successive subpulses pS. The subpulses pS have, as a function of time t, the shape $$pS(t)=AS \cdot A0(t) \cdot \sin(2\pi f t + \phi S) \quad (4)$$

AS is a factor, A0 is a basic amplitude curve (e.g., an envelope curve), and φS is a phase. The basic amplitude curve A0 is uniform for all subpulses pS. The factors AS and/or the phases φS and the frequency f may, for example, be determined subpulse-specifically. For example, the high-frequency transmit pulse P (e.g., the total number of subpulses pS) causes an excitation of atomic nuclei of the corresponding type of nucleus that is independent of variations in the Larmor frequency f of the type of atomic nucleus in question. The corresponding pulse design is known to people skilled in the art. By way of example, reference is made to the paper by Chun-yu Yip et al. mentioned above.

According to FIG. 4, the gradient currents Ix, Iy, Iz may be applied between subpulses pS of this kind (e.g., the gradient magnetic system exposed to the corresponding gradient currents Ix, Iy, Iz). The gradient currents Ix, Iy, Iz, as shown in FIG. 4, are determined such that the zero moment has the value zero, and the first moment has a value different from zero. The basic magnetic field B0 is hence exposed to bipolar gradient magnetic fields Gx, Gy, Gz, with which the zero moment also has the value zero, and the first moment has a value different from zero. The bipolar gradient magnetic fields Gx, Gy, Gz maintain the phase relation for static spins, but dephase moving spins.

In this case, the slice selection may be approximately separated from the dephasing between the subpulses pS. The time between two subpulses pS is the time between the excitation k-space zero crossings (e.g., the middle of the subpulses pS with the maximum high-frequency amplitude). In this case, spins moving along the slice selection gradients experience different dephasing than static spins.

Figure 5:
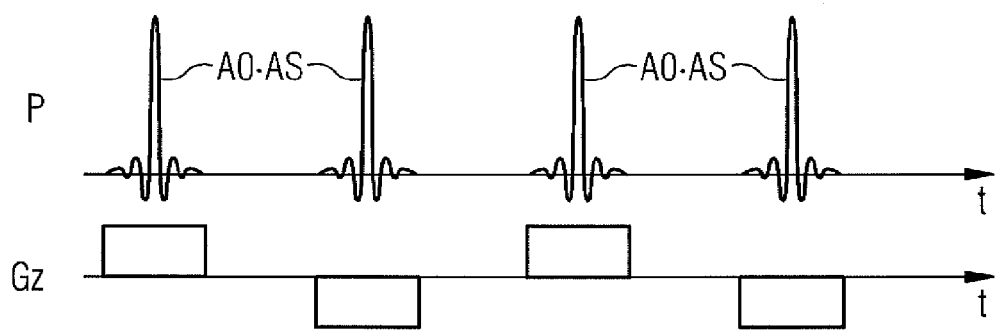

Alternatively, according to FIG. 5, the subpulses pS may be determined such that the subpulses pS are slice-selective. In this case, the subpulses pS have the functional shape according to equation 4. The difference from FIG. 4 is that the envelope curves A0 are determined according to the desired slice selectivity. The corresponding pulse design is known to people skilled in the art.

The gradient currents Ix, Iy, Iz applied during the subpulses pS may also be used for velocity selection. Alternatively, monopolar gradient trajectories that refocus the dephasing through the disk between two pulses in each case and balance out the subpulses pS under gradients of the same polarity may be used.

In the embodiment according to FIG. 5, the gradient magnetic system 3 is again exposed to the gradient currents Ix, Iy, Iz. Unlike the case in FIG. 4, however, the exposure takes place during the exposure of the examination volume 2 to the subpulses pS (e.g., simultaneously with the subpulses pS). With the embodiment according to FIG. 5, the gradient currents Ix, Iy, Iz are of the same size from subpulse pS to subpulse pS. However, the polarity changes from subpulse pS to subpulse pS. The strength is characteristic for the selected velocity level.

Figure 6:
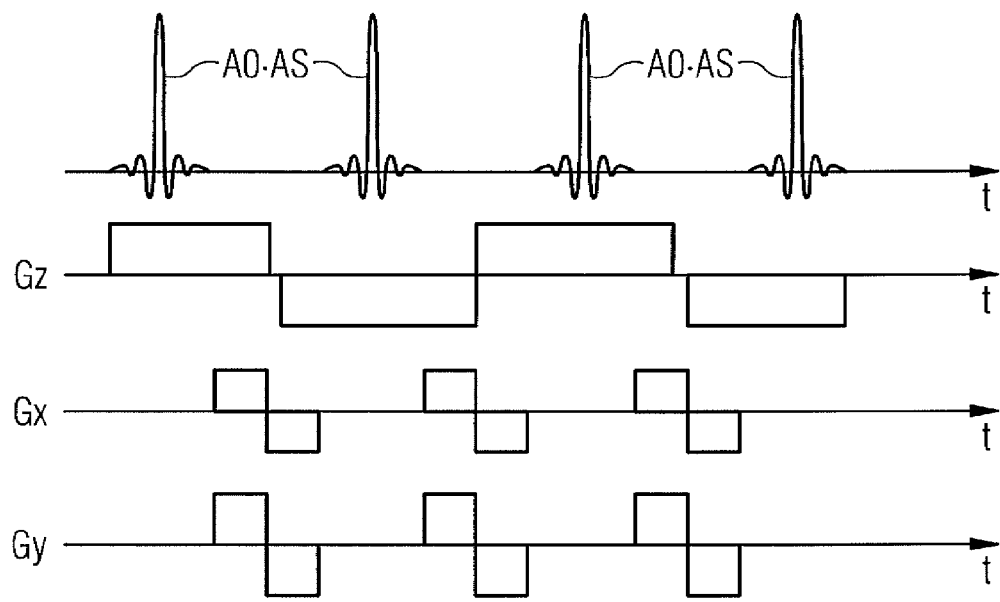

In one embodiment, the procedures in FIGS. 4 and 5 may be combined. This is shown in FIG. 6.

Figure 7:
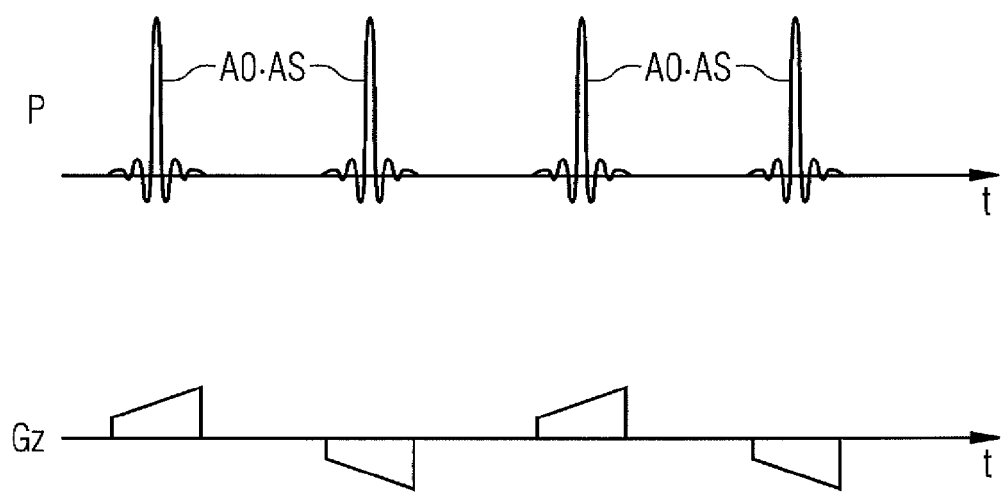

Alternatively, according to FIG. 7, the gradient currents Ix, Iy, Iz, to which the gradient magnetic system 3 is exposed during the exposure of the examination volume 2 to the subpulses pS, may be determined such that the subpulses pS generate a time-varying gradient trajectory. This is shown in FIG. 7.

In one embodiment, the resulting magnetization may be described according to equation $$M(\vec{r}) = i\gamma M_0(\vec{r}) \int_0^T \mathrm{HF}(t) \exp[i\vec{k}(t)\vec{r} + i\Delta\omega(\vec{r})(T-t) + i\vec{k}(t)\vec{v}] dt \quad (3)$$

Then, a standard N is described according to the relation $$N = \| M(\vec{r}, P, Ix, Iy, Iz, \Delta\omega(\vec{r}), |v-v0|<\epsilon) -$$
$$M^* \| + \lambda \| M(\vec{r}, \ldots, |v-v0|>\epsilon) \| \quad (6)$$

M* is the desired (e.g., complex) target magnetization. λ is an optional weighting factor.

The procedure according to equation 6 is used to match the high-frequency pulses P and the associated gradient currents Ix, Iy, Iz to each other such that only atomic nuclei with a velocity within the predetermined velocity range 13 are excited. If, vice versa, only the atomic nuclei with velocities v outside the predetermined velocity range 13 are excited, only the parameters "|v−v0|<ε" and "|v−v0|>ε" may be interchanged in equation 6.

The standard N is minimized by varying the high-frequency transmit pulses P and the gradient currents Ix, Iy, Iz. The corresponding results are the high-frequency pulses P and gradient currents Ix, Iy, Iz sought.

Hence, an iterative pulse design method is used to vary the basic amplitude curve A0(t) and the gradient trajectory Gx(t), Gy(t), Gz(t) in order to minimize the difference between the specified target magnetization M* and the magnetization M calculated by the Bloch equation. This minimization may also allow for the spatial distribution of the Larmor frequency.

According to one embodiment, in addition to the phase development due to the spatial variations in the Larmor frequency, a velocity-dependent phase term describing the phase development of the moving spins in a gradient field may be inserted in the motion equation for the spins. The pulse design problem is formulated as a minimization problem and solved using iterative numerical methods.

For single-channel transmit coil systems (e.g., only one single transmitting antenna is available), the local phase is influenced in that during the exposure of the examination volume 2 to the subpulses pS, simultaneously temporally non-constant gradients are applied. In one embodiment, the subpulses pS may be varied individually in parallel to temporally constant or varying gradient magnetic fields Gx, Gy, Gz. Therefore, as shown in FIG. 1, if the transmit coil system 5 includes a plurality of transmitting antennas 14, the transmitting antennas 14 may simultaneously be exposed to respective high-frequency transmit pulses P. The high-frequency transmit pulses P may be determined individually for the respective transmitting antenna 14.

The average velocity v0, at which the magnetic resonance signals are to be excited, may be determined, as required. For example, the predetermined velocity range 13 may have the velocity zero. This is, for example, advisable if only atomic nuclei with velocities v outside of the predetermined velocity range 13 are to be excited. In the opposite case (e.g., if only atomic nuclei with velocities v within the predetermined velocity range 13 are to be excited), the predetermined velocity range 13 may not have the velocity zero.

As early as during the excitation, only spins with a specific velocity measure may be excited (e.g., to distinguish static spins from moving spins). The velocity selection (e.g., as early as during the excitation of the spins) is expected to have advantages over implementation at the receive end. For example, unlike the case with the method at the receive end, subtraction methods that may lead to artifacts due to inconsistent intermediate measurements may not be used. However, subtraction methods may also be used. The measuring time may also be reduced.

Although the details of the invention are illustrated and described with reference to the exemplary embodiments, the invention is not restricted to the disclosed examples. The person skilled in the art will be able to derive other variations from the exemplary embodiments without leaving the scope of the invention.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for operating a magnetic resonance system, the method comprising:

exposing a transmit coil system acting on an examination volume to high-frequency transmit pulses so that atomic nuclei of a predetermined type of atomic nucleus of an examination object introduced into the examination volume are excited by the high-frequency transmit pulses to cause an emission of magnetic resonance signals;

exposing a gradient magnetic system acting on the examination volume to a gradient current at a same time as an exposure of the examination volume to a subpulse of the high-frequency transmit pulses so that gradient magnetic fields are superimposed on a temporally static and locally homogeneous basic magnetic field generated by a basic magnet in the examination volume; and matching the gradient current and the subpulse of the high-frequency transmit pulses at the same time to each other such that the atomic nuclei excited to cause the emission of magnetic resonance signals are exclusively atomic nuclei with a velocity within a predetermined velocity range, while the excitation is independent of variations in a Larmor frequency of a relevant type of atomic nucleus caused by inhomogeneities of the basic magnetic field, chemical displacement, or the inhomogeneities of the basic magnetic field and the chemical displacement.

2. The method as claimed in claim 1, wherein the transmit coil system comprises a plurality of transmitting antennas, and wherein exposing the transmit coil system comprises simultaneously exposing the plurality of transmitting antennas to respective high-frequency transmit pulses.

3. The method as claimed in claim 1, wherein the high-frequency transmit pulses comprise a plurality of temporally successive subpulses with a shape $$pS(t)=AS \cdot A0(t) \cdot \sin(2\pi ft+\phi S), \text{ and}$$

wherein pS is a respective subpulse, t is a time, AS is a factor, A0 is a uniform basic amplitude curve for all subpulses, f is a frequency, and $\phi S$ is a phase.

4. The method as claimed in claim 3, wherein the factor, the frequency, the phase, or a combination thereof is subpulse-specific.

5. The method as claimed in claim 3, further comprising exposing the gradient magnetic system to gradient currents during the exposure of the examination volume to the subpulses.

6. The method as claimed in claim 5, further comprising determining the gradient currents, to which the gradient magnetic system is exposed during the exposure of the examination volume to the subpulses, such that the gradient currents generate a time-varying gradient trajectory.

7. The method as claimed in claim 1, wherein the predetermined velocity range does not encompass velocity zero.

8. The method as claimed in claim 2, wherein the high-frequency transmit pulses comprise a plurality of temporally successive subpulses with a shape $$pS(t)=AS \cdot A0(t) \cdot \sin(2\pi ft+\phi S), \text{ and}$$

wherein pS is a respective subpulse, t is a time, AS is a factor, A0 is a uniform basic amplitude curve for all subpulses, f is a frequency, and $\phi S$ is a phase.

9. The method as claimed in claim 4, further comprising exposing the gradient magnetic system to gradient currents during the exposure of the examination volume to the subpulses.

10. The method as claimed in claim 2, wherein the predetermined velocity range does not encompass velocity zero.

11. The method as claimed in claim 3, wherein the predetermined velocity range does not encompass velocity zero.

12. In a non-transitory computer-readable storage medium that stores instructions executable by a controller for a magnetic resonance system to operate the magnetic resonance system, the instructions comprising:

exposing a transmit coil system acting on an examination volume to high-frequency transmit pulses so that atomic nuclei of a predetermined type of atomic nucleus of an examination object introduced into the examination volume are excited by the high-frequency transmit pulses to cause an emission of magnetic resonance signals;

exposing a gradient magnetic system acting on the examination volume to a gradient current at a same time as an exposure of the examination volume to a subpulse of the high-frequency transmit pulses so that gradient magnetic fields are superimposed on a temporally static and locally homogeneous basic magnetic field generated by a basic magnet in the examination volume; and matching the gradient current and the subpulse of the high-frequency transmit pulses at the same time to each other such that the atomic nuclei excited to cause the emission of magnetic resonance signals are exclusively atomic nuclei with a velocity within a predetermined velocity range, while the excitation is independent of variations in a Larmor frequency of a relevant type of atomic nucleus caused by inhomogeneities of the basic magnetic field, chemical displacement, or the inhomogeneities of the basic magnetic field and the chemical displacement.

13. A controller for a magnetic resonance system, the controller being configured to operate the magnetic resonance system, wherein the controller is further configured to:
expose a transmit coil system acting on an examination volume to high-frequency transmit pulses so that atomic nuclei of a predetermined type of atomic nucleus of an examination object introduced into the examination volume are excited by the high-frequency transmit pulses to cause an emission of magnetic resonance signals;

expose a gradient magnetic system acting on the examination volume to a gradient current at a same time as an exposure of the examination volume to a subpulse of the high-frequency transmit pulses so that gradient magnetic fields are superimposed on a temporally static and locally homogeneous basic magnetic field generated by a basic magnet in the examination volume; and match the gradient current and the subpulse of the high-frequency transmit pulses at the same time to each other such that the atomic nuclei excited to cause the emission of magnetic resonance signals are exclusively the atomic nuclei with a velocity within a predetermined velocity range, while the excitation is independent of variations in a Larmor frequency of a relevant type of atomic nucleus caused by inhomogeneities of the basic magnetic field, chemical displacement, or the inhomogeneities of the basic magnetic field and the chemical displacement.

14. A magnetic resonance system comprising:

a transmit coil system operable to act on an examination volume;

a gradient magnetic system operable to act on the examination volume;

a basic magnet operable to generate a temporally static and locally homogeneous basic magnetic field in the examination volume; and a controller configured to:

expose the transmit coil system acting on the examination volume to high-frequency transmit pulses so that atomic nuclei of a predetermined type of atomic nucleus of an examination object introduced into the examination volume are excited by the high-frequency transmit pulses to cause an emission of magnetic resonance signals;

expose the gradient magnetic system acting on the examination volume to gradient current at a same time as an exposure of the examination volume to a subpulse of the high-frequency transmit pulses so that gradient magnetic fields are superimposed on the temporally static and locally homogeneous basic magnetic field generated by the basic magnet in the examination volume; and match the gradient current and the subpulse of the high-frequency transmit pulses at the same time to each other such that the atomic nuclei excited to cause the emission of magnetic resonance signals are exclusively the atomic nuclei with a velocity within a predetermined velocity range, while the excitation is independent of variations in a Larmor frequency of a relevant type of atomic nucleus caused by inhomogeneities of the basic magnetic field, chemical displacement, or the inhomogeneities of the basic magnetic field and the chemical displacement.

15. The controller as claimed in claim 13, wherein the controller is a software-programmable control, wherein software is supplied to the controller for programming via a network connection or an electronic data carrier.

* * * * *